United States Patent [19]
Gillette

[11] Patent Number: 6,028,438
[45] Date of Patent: Feb. 22, 2000

[54] CURRENT SENSE CIRCUIT

[75] Inventor: Garry C. Gillette, San Jose, Calif.

[73] Assignee: Credence Systems Corporation, Fremont, Calif.

[21] Appl. No.: 08/961,600

[22] Filed: Oct. 31, 1997

[51] Int. Cl.[7] .............................. G01R 31/28; G05F 1/10
[52] U.S. Cl. ............................................ 324/765; 327/541
[58] Field of Search ................................ 324/765, 537; 327/334, 541, 404

[56] References Cited

U.S. PATENT DOCUMENTS

| | | | |
|---|---|---|---|
| 4,855,685 | 8/1989 | Hochschild | 327/541 |
| 5,254,883 | 10/1993 | Horowitz et al. | 327/541 |
| 5,506,541 | 4/1996 | Herndon | 327/541 |
| 5,844,913 | 12/1998 | Hassoun et al. | 324/537 |

Primary Examiner—Ernest Karlsen
Attorney, Agent, or Firm—Smith-Hill and Bedell

[57] ABSTRACT

A current sense circuit for use in a semiconductor tester has a voltage source for forcing a voltage to a first node of the current sense circuit, a current sense resistor having a first terminal connected to the first node and a second terminal connected to a second node for connection to a pin of a device under test (DUT), and a differential amplifier for measuring voltage drop across the current sense resistor. The current sense resistor is composed of a network of switchable semiconductor resistor devices each having at least a first resistance state and a second resistance state, in which the resistor device has first and second different resistance values respectively, and a device for selectively controlling the states of the resistor devices, whereby the resistance value of the current sense resistor can be selectively varied.

8 Claims, 2 Drawing Sheets

CURRENT SENSE CIRCUIT

BACKGROUND OF THE INVENTION

This invention relates to a current sense circuit.

A semiconductor integrated circuit tester is used for testing semiconductor integrated circuit devices having numerous I/O pins. The tester has numerous tester pins for connection to the I/O pins respectively of a device under test (DUT) and a pin electronics circuit is associated with each tester pin. It is known for the pin electronics circuit to be integrated in a CMOS integrated circuit die. Depending on its mode of operation, each pin electronics circuit can supply a stimulus signal to the corresponding DUT pin or receive a response signal from the DUT pin.

The pin electronics circuit may include a force amplifier for forcing a specified voltage on a pin of the DUT. The current flowing into the DUT pin is converted to a voltage by a current sense resistor and the voltage drop across the current sense resistor is amplified by a differential amplifier, which is also included in the pin electronics circuit and provides an output voltage referenced to ground and proportional to the current through the current sense resistor. The output voltage of the differential amplifier is measured or is compared to fixed high and low limits. This type of test is commonly known as a parametric measurement unit (PMU) test and typically verifies that the connection between the pin and the tester is correct and that the leakage current at the pin is less than a specified maximum.

The range of current values that can be measured depends on the resistance value of the current sense resistor and the input range of the differential amplifier. If a wide dynamic range of current is to be measured without loss of accuracy, the resistance of the current sense resistor must be selectively variable. This may be accomplished by using a network of resistors, of different values, and a switch for selecting one of the resistors depending on the current range to be measured. Hitherto, the network of resistors has been implemented by discrete physical resistors which are external of the CMOS integrated circuit in which the pin electronics are implemented and are individually selected by relays or solid state switches. The discrete physical resistors and the associated relays require considerable space at each pin.

SUMMARY OF THE INVENTION

In accordance with a first aspect of the invention there is provided a current sense circuit for use in a semiconductor tester, comprising a voltage source for forcing a voltage to a first node of the current sense circuit, a current sense resistor means having a first terminal connected to said first node and a second terminal connected to a second node for connection to a pin of a device under test (DUT), and a means for measuring voltage drop across the current sense resistor means, and wherein the current sense resistor means comprises a network of switchable semiconductor resistor devices each having at least a first resistance state and a second resistance state, in which the resistor device has first and second different resistance values respectively, and a means for selectively controlling the states of the resistor devices, whereby the resistance value of the current sense resistor means can be selectively varied.

In accordance with a second aspect of the invention there is provided a current sense circuit for use in a semiconductor tester, comprising a voltage source for forcing a voltage to a first node of the current sense circuit, a current sense resistor means having a first terminal connected to said first node and a second terminal connected to a second node for connection to a pin of a device under test (DUT), and a means for measuring voltage drop across the current sense resistor means, and wherein the current sense resistor means comprises a network of parallel CMOS transmission gates each having an enabled state, in which the transmission gate has a relatively low resistance value, and a disabled state, in which the transmission gate has a relatively high resistance value, and a means for selectively controlling the states of the respective transmission gates, whereby the resistance value of the current sense resistor means can be selectively varied.

BRIEF DESCRIPTION OF THE DRAWINGS

For a better understanding of the invention, and to show how the same may be carried into effect, reference will now be made, by way of example, to the accompanying drawings, in which.

DETAILED DESCRIPTION

Figure 1:
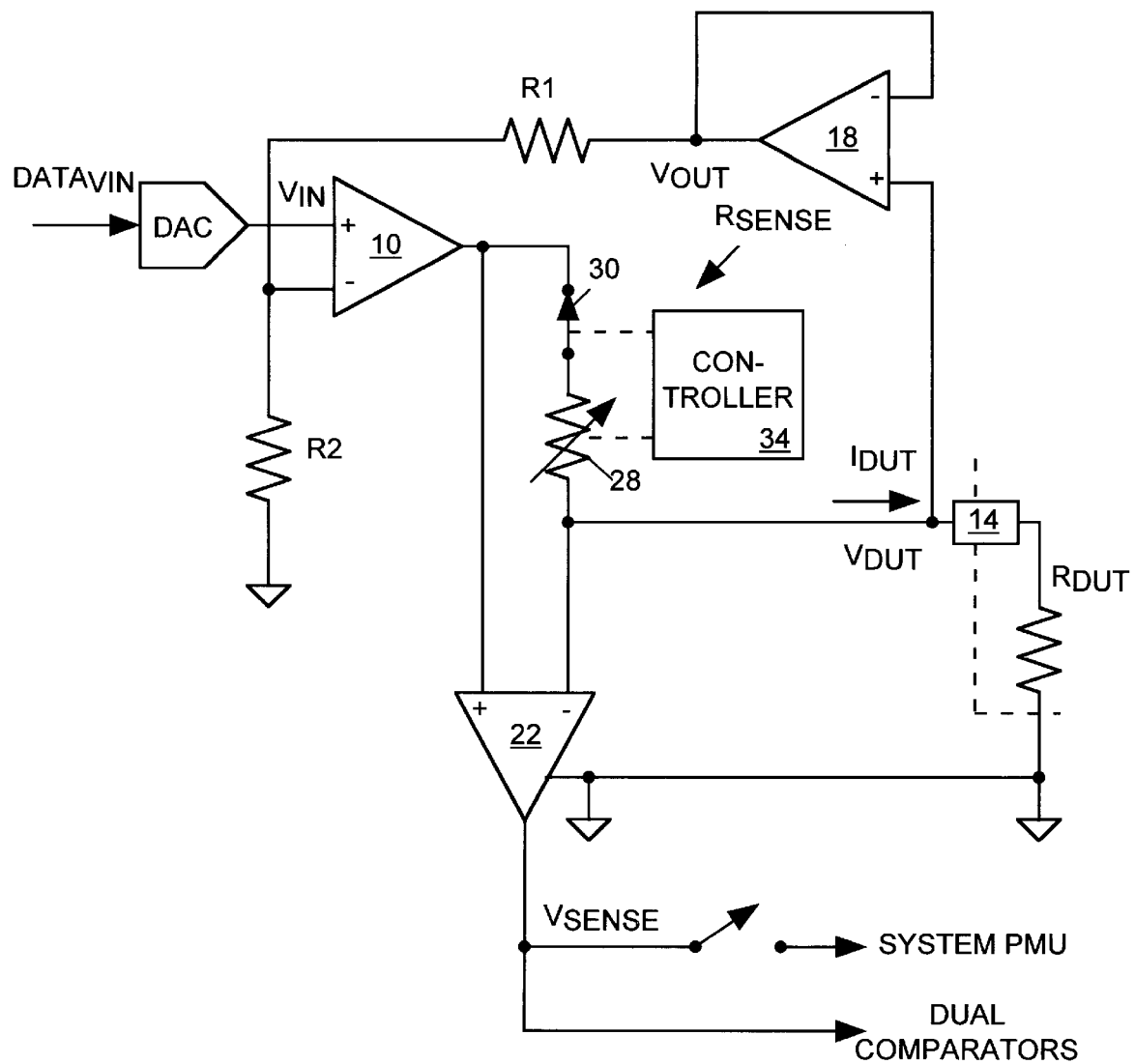
FIG. 1 is a schematic diagram of a current sense circuit in accordance with the present invention.

FIG. 1 illustrates part of a pin electronics circuit used in a semiconductor integrated circuit tester. The pin electronics circuit serves as a channel of the tester and several such pin electronics circuits are provided on a single pin card. Some resources of the tester, in particular a system PMU, which typically includes an analog-to-digital converter, are shared among all the channels of the tester whereas other resources, such as dual voltage comparators for testing high and low limit values, are provided on a per card basis and are shared among the channels on a single pin card.

The pin electronics circuit shown in FIG. 1 includes a programmable voltage source, such as a digital-to-analog converter, which generates a voltage $V_{IN}$ which is applied to the non-inverting input of a force amplifier 10. The output of the force amplifier 10 is connected through a current sense resistor $R_{SENSE}$ to a pin 14 of a semiconductor integrated circuit device under test (DUT). The amplifier 10 supplies a current $I_{DUT}$ to the pin 14, which is then at a voltage $V_{DUT}$. The pin 14 is also connected to the non-inverting input of an amplifier 18 whose output is connected through a voltage divider R1, R2 to ground. The amplifier 18 is an integrated op-amp connected as a unity gain follower with negligibly low input current. Consequently, the output voltage $V_{OUT}$ of the amplifier 18 is essentially equal to the voltage $V_{DUT}$. The tap of the voltage divider is connected to the inverting input of the amplifier 10. Preferably, R1 and R2 are equal in value and so the feedback voltage supplied to the amplifier 10 is equal to $V_{OUT}/2$. The amplifier 10 is a high gain op-amp and it delivers the current $I_{DUT}$ at whatever level is required to servo $V_{IN}-V_{OUT}/2$ to zero. Consequently, $V_{DUT}$ is substantially equal to $2*V_{IN}$.

A voltage measuring amplifier 22 is connected across the current sense resistor $R_{SENSE}$ and provides an output voltage signal $V_{SENSE}$. The amplifier 22 is a differential amplifier with unity gain, negligible input current and high common mode voltage rejection and so the output voltage $V_{SENSE}$ accurately represents the voltage drop across the current sense resistor, referenced to ground and substantially independent of the voltage $V_{DUT}$. The output voltage $V_{SENSE}$ can be connected to the system PMU or to the pin card dual comparators. The amplifier 22 may have the same topology as the voltage translation circuit shown in co-pending patent application Ser. No. 08/961,645 filed Oct. 31, 1997.

The resistance value of the current sense resistor $R_{SENSE}$ is selectively variable, in order to allow adjustment of the current range to be measured, and the connection between the output of the amplifier 10 and the DUT pin 14 can be interrupted to allow normal functional testing to be performed at the DUT pin. Thus, the current sense resistor is illustrated in FIG. 1 as a variable resistor 28 connected in series with a switch 30 and a controller 34 which controls the state of the switch 30 and the resistance value of the variable resistor 28.

Figure 2:
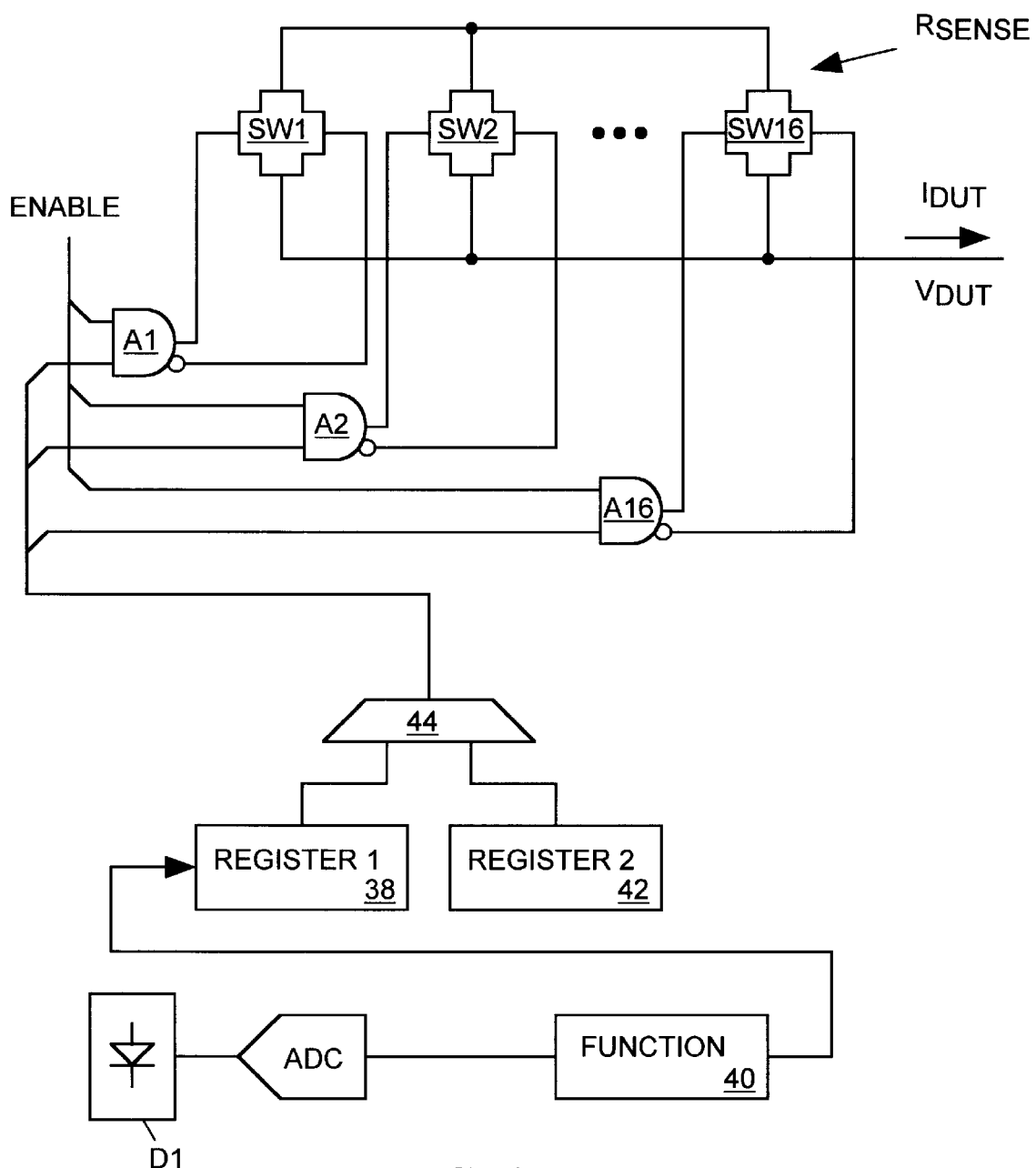
FIG. 2 is a more detailed schematic diagram of a portion of the circuit shown in FIG. 1.

Referring to FIG. 2, the current sense resistor $R_{SENSE}$ is in practice implemented by an array of parallel semiconductor switches SW1 . . . SW16 fabricated in the same CMOS integrated circuit die as the amplifiers 10 and 22 and other components of the pin electronics circuit. Each switch SW has an enabled, or closed, state in which it is conductive and a disabled, or open, state in which it is non-conductive and may be implemented by a CMOS transmission gate (T-gate). Each switch SW has two control gate terminals and is enabled when one terminal is high and the other terminal is low and is disabled when the terminals are in the opposite respective states. The sixteen switches are of binary weighted conductance, such that the conductance of the switch $SW_1$, when enabled, is twice that of the switch $SW_2$, which in turn is twice that of the switch $SW_3$, and so on. This provides $2^{16}$ selectable resistance values. The combination in which the switches SW are enabled determines the value of the resistance $R_{SENSE}$. In a practical implementation, a range of values of $R_{SENSE}$ from 50 ohms to 10,000 ohms has been provided.

Sixteen AND gates $A_1$–$A_{16}$ and a register 38 storing a data word $DATA_R$ composed of sixteen binary values $R_1$–$R_{16}$ are integrated in the same CMOS integrated circuit die as the switches $SW_1$–$SW_{16}$. Each AND gate $A_i$ (i=1 . . . 16) has one input connected to an output of the register 38 and a second input connected to receive an enable signal, which is distributed to all the AND gates. Each AND gate $A_i$ has a first (non-inverted) output connected to one terminal of the switch $SW_i$ and a second (inverted) output connected to the other terminal of the switch. In this manner, the AND gate $A_i$ controls the state of the switch $SW_i$ depending on the value $R_i$. When the enable signal is in the logic one state, the output of the amplifier 10 is connected to the DUT pin 14 through the current sense resistor $R_{SENSE}$, having the resistance value set by the value of the data word $DATA_R$.

When the output of the amplifier 10 is to be disconnected from the DUT pin 14, the switches SW can be set to the open (disabled) state by placing the enable signal in the logic zero state. In this state, the switches SW have very low leakage and impose very low capacitive loading on the DUT pin 14.

The resistance of the CMOS switches $SW_1$–$SW_{16}$ will vary as a function of temperature, typically increasing 1% per degree C. over a fairly wide range of temperatures. Accordingly, a change in temperature of the integrated circuit die in which the switches are fabricated will have a significant effect on the load resistance of a given combination of switches SW. A diode D1 is formed in the same integrated circuit die as the switches SW and can be used to generate a voltage signal which is proportional to temperature. If the data value to be stored in the register 38 to achieve a desired resistance value is calibrated at a temperature $T_0$, at which the voltage signal provided by the diode has a value $V_0$, then the data value required to program the register during operation at a temperature T, at which the voltage signal provided by the diode has a value $V_T$, can be expressed as $$DATA_R = a(T-T_0) + DATA_0$$

where a is a constant.

In order to compensate for the effect of temperature on load resistance, the voltage signal provided by the diode D1 is converted to digital form and is used as one input to a mathematical function 40, such as a look-up table, which receives the value $DATA_0$ as another input and returns the value $DATA_R$. In this manner, the resistance value of the switches $SW_1$–$SW_{16}$ is rendered independent of temperature.

In another modification shown in FIG. 2, an additional control register 42 containing a preset value is formed in the same integrated circuit die as the register 38 and a 2×1 multiplexer 44 is connected between the outputs of the registers 38 and 42 and the inputs of the AND gates A1–A16. The multiplexer 44 is controlled by a control signal so that either the program register 38 or the control register 42 is selected for providing the data word that selects the pattern in which the switches $SW_1$–$SW_{16}$ are to be enabled. By using the multiplexer to switch from the program register 38 to the control register 42, the preset value in the control register can be selected without it being necessary to halt the test sequence and reload the program register 38, which is advantageous because reloading time is much longer than a cycle time.

The circuit described above provides the capability of measuring leakage current on a per-pin basis without use of relays and in a manner that consumes very little power. Using current technology, the circuit can be integrated at a level such that a single integrated circuit die can contain the pin electronics circuitry and the switch requirements for eight DUT pins.

Subject matter disclosed in this application is related to subject matter disclosed and claimed in one or more of patent application Ser. No. 08/961,645 filed Oct. 31, 1997, patent application Ser. No. 08/962,051 filed Oct. 31, 1997, and patent application Ser. No. 08/962,050 filed Oct. 31, 1997, now U.S. Pat. No. 5,955,890, the entire disclosure of each of which is hereby incorporated by reference herein. Each of these copending applications discloses a measurement circuit in which one of the circuit elements is an array of CMOS transmission gates. By use of suitable switching, the same array of transmission gates can be used to implement each of the circuits.

It will be appreciated that the invention is not restricted to the particular embodiments that have been described and shown, and that variations may be made therein without departing from the scope of the invention as defined in the appended claims and equivalents thereof.

I claim:

1. A current sense circuit for use in a semiconductor tester, the current sense circuit having a first node for connection to a pin of a device under test (DUT) and comprising:

a current sense resistor means having a first terminal connected to said first node and a second terminal connected to a second node, a voltage source connected to the second node for supplying current to the first node by way of the current sense resistor means, and a means for measuring voltage drop across the current sense resistor means, and wherein the current sense resistor means comprises a network of switchable semiconductor resistor devices each having at least a first resistance state and a second resistance state, in which the resistor device has first and second different resistance values respectively, and a means for selectively controlling the states of the resistor devices, whereby the resistance value of the current sense resistor means can be selectively varied.

2. A current sense circuit according to claim 1, wherein the semiconductor resistor devices comprise respective CMOS transmission gates.

3. A current sense circuit according to claim 1, wherein the semiconductor resistor devices are connected in parallel between the first and second nodes, the first resistance state of each resistor device is an enabled state, in which it has a relatively low resistance, and the second resistance state of each resistor device is a disabled state, in which it has a relatively high resistance, and the conductance values of the resistor devices in the enabled state are binary weighted.

4. A current sense circuit according to claim 1, wherein the voltage source comprises a programmable device for generating an output signal at a predetermined voltage level, a force amplifier having a first input connected to receive the output signal of the programmable device and having an output connected to said second node, and a feedback means connected between the first node and a second input of the force amplifier for causing the force amplifier to supply current at a level such that the first node is forced to a voltage level depending on said predetermined voltage level.

5. A current sense circuit according to claim 4, wherein the feedback means comprises a unity gain amplifier and a voltage divider, the voltage divider having a tap connected to the second input of the force amplifier, whereby said predetermined voltage level is greater in magnitude that the voltage level at the inputs of the force amplifier.

6. A current sense circuit for use in a semiconductor tester, the current sense circuit having a first node for connection to a pin of a device under test (DUT) and comprising:

a current sense resistor means having a first terminal connected to said first node and a second terminal connected to a second node, a voltage source connected to the second node for supplying current to the first node by way of the current sense resistor means, and a means for measuring voltage drop across the current sense resistor means, and wherein the current sense resistor means comprises a network of parallel CMOS transmission gates each having an enabled state, in which the transmission gate has a relatively low resistance value, and a disabled state, in which the transmission gate has a relatively high resistance value, and a means for selectively controlling the states of the respective transmission gates, whereby the resistance value of the current sense resistor means can be selectively varied.

7. A current sense circuit according to claim 6, wherein the voltage source comprises a programmable device for generating an output signal at a predetermined voltage level, a force amplifier having a first input connected to receive the output signal of the programmable device and having an output connected to said second node, and a feedback means connected between the first node and a second input of the force amplifier for causing the force amplifier to supply current at a level such that the first node is forced to a voltage level depending on said predetermined voltage level.

8. A current sense circuit according to claim 7, wherein the feedback means comprises a unity gain amplifier and a voltage divider, the voltage divider having a tap connected to the second input of the force amplifier, whereby said predetermined voltage level is greater in magnitude that the voltage level at the inputs of the force amplifier.

* * * * *